US008676525B2

(12) United States Patent
Holmberg et al.

(10) Patent No.: US 8,676,525 B2
(45) Date of Patent: Mar. 18, 2014

(54) CURRENT MEASUREMENT IN SWITCHED MODE POWER SUPPLY

(75) Inventors: Torbjorn Holmberg, Kalmar (SE); Magnus Karlsson, Oskarshamn (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 196 days.

(21) Appl. No.: 13/321,915

(22) PCT Filed: Jun. 3, 2009

(86) PCT No.: PCT/EP2009/056792
§ 371 (c)(1),
(2), (4) Date: Nov. 22, 2011

(87) PCT Pub. No.: WO2010/139358
PCT Pub. Date: Dec. 9, 2010

(65) Prior Publication Data
US 2012/0078556 A1    Mar. 29, 2012

(51) Int. Cl.
*G06F 19/00* (2011.01)
(52) U.S. Cl.
USPC .............. 702/64; 324/427; 700/1; 702/60
(58) Field of Classification Search
USPC ............ 702/60, 64, 65, 182, 189, 193, 196; 324/427; 700/1, 29; 310/61
See application file for complete search history.

(56) References Cited

U.S. PATENT DOCUMENTS

| 5,703,486 A * | 12/1997 | Arai et al. ................. 324/427 |
| 5,789,923 A * | 8/1998 | Shimoyama et al. ........ 324/427 |
| 2007/0108853 A1* | 5/2007 | Shah et al. .................. 310/61 |
| 2007/0108953 A1 | 5/2007 | Latham |
| 2007/0112443 A1* | 5/2007 | Latham et al. ............... 700/29 |

* cited by examiner

*Primary Examiner* — John H Le

(57) ABSTRACT

A method of determining a current in a switched mode power supply. The method comprises: storing values representing at least one pre-calculated matrix A; receiving measured current values; and using the stored values representing the matrix A and the received current values to calculate a respective initial value for each of the coefficients of the line and for each measured current value: calculating an estimated current using the equation of the line and the calculated initial values of the coefficients; determining a difference between the measured current value and the estimated current value to generate a difference value, and comparing the difference value against a threshold and, if the difference value is greater than the threshold, calculating updated values of the coefficients using stored values representing matrix A and difference value. A value for the current in the switched mode power supply is determined using the updated values of the coefficients

16 Claims, 10 Drawing Sheets

CURRENT MEASUREMENT IN SWITCHED MODE POWER SUPPLY

TECHNICAL FIELD

The present invention generally relates to the field of switched mode power supplies (sometimes referred to as switch mode supplies or switching mode power supplies) and more specifically to determination of a current in a switched mode power supply.

BACKGROUND

The switched mode power supply (SMPS) is a well-known type of power converter having a diverse range of applications by virtue of its small size and weight and high efficiency, for example in personal computers and portable electronic devices such as cell phones. An SMPS achieves these advantages by switching a switching element such as a power MOSFET at a high frequency (usually tens to hundreds of kHz), with the frequency or duty cycle of the switching being adjusted using a feedback signal to convert an input voltage to a desired output voltage. An SMPS may take the form of a rectifier (AC/DC converter), a DC/DC converter, a frequency changer (AC/AC) or an inverter (DC/AC).

It is desirable to increase the accuracy with which current in a SMPS can be determined for a number of reasons. For example, the emergence of ever more advanced and computationally intensive signal and communication processing algorithms has fuelled the need for new low-voltage CMOS technology for their implementation. This puts new challenging requirements on the power supply, such as tighter voltage tolerance bands and the ability to provide increased current levels. In order to meet these requirements, it is necessary to improve various aspects of the SMPS's operation (e.g. current feedback control, detection of continuous and discontinuous conduction modes, current protection and system identification) by increasing the accuracy of the current measurement upon which these rely. Accurate current measurement also enables accurate diode emulation in synchronous rectified power converters, thus improving their low load efficiency.

Known current estimation methods employed in an SMPS in the form of a switched mode DC/DC power supply will now be described with reference to FIGS. 1 and 5.

FIG. 1 is a simplified circuit diagram of a switched mode DC/DC power supply 10 which converts an input voltage $V_{in}$ to a desired output voltage $V_{out}$. The power supply 10 comprises an inductor 20, a capacitor 30, a diode 40, a power transistor 50 and a pulse-width modulating (PWM) controller 60. The PWM controller applies voltage pulses 70 at an appropriate frequency (e.g. 30 kHz) to the gate of the power transistor 50. The PWM controller regulates the output voltage $V_{out}$ by adjusting the duty cycle D of the pulses (defined by $D=T_{ON}/T_s$, where $T_{ON}$ is the duration of a pulse and $T_s$ is the switch period) on the basis of a feedback signal which is obtained from a measurement of the current in the inductor. In the example of FIG. 1, the current is measured using resistor 80.

In this arrangement, the current (i) in the inductor 20 varies with time (t) in a generally saw-tooth manner as shown in FIG. 5, increasing from a minimum value $I_{min}$ to a maximum value $T_{max}$ during a period $DT_s$ when the transistor is switched ON, before decreasing to $I_{min}$ during a period $(1-D)T_s$ when the transistor is switched OFF. The PWM controller 60 repeatedly measures the current a number of times during a switch period $T_s$ and calculates a current value using samples obtained during the ON-period $DT_s$ or OFF-period $(1-D)T_s$. However, the switching of the transistor can cause transients which introduce errors in the current values measured shortly after a transition from an ON-period to the following OFF-period or from an OFF-period to the next ON-period. For this reason, it is preferable to disregard the samples obtained in a blanking period $T_B$ immediately following a transition when performing a current calculation. In the present example, the calculation is based on a number of measured current sample values which are obtained over a time $(1-D)T_s-T_B$ during the OFF-period.

Having obtained the current samples, it is then necessary to process them to calculate an overall current value. A number of known techniques exist for doing this. For example, the use of the statistically robust median value of sampled current values for current protection is described in "ZL2005 Current Protection and Measurement" (Zilkerlabs Application Note AN15, www.zilkerlabs.com), where a digital filter is used for increasing the accuracy of current monitoring over the PMBus. However, this method introduces an offset error that varies with the blanking time and the duty cycle. Hence, the accuracy and latency of this method is not very good.

SUMMARY OF THE INVENTION

Embodiments of the present invention make use of least squares regression for estimating the current. This statistical method has the advantage of simplicity and the existence of an explicit solution.

The use of linear least squares regression for estimating the current in the inductor makes it possible to use a trade-off between the oversampling ratio (that is, the ratio of the sampling frequency to the switching frequency) and the number of bits in the current ADC, and improves the accuracy of the measurements. In the embodiments, the operations are data-independent and are suitable for implementation in hardware, software or a mixture of hardware and software. Furthermore an efficient algorithm for computing the linear least squares regression is provided. In fact, tests have shown that after only 1 or 2 iterations the calculated result has the same accuracy as the best existing statistical method.

In the least squares regression algorithm outliers will affect the result. In order to reduce the influence of outliers, embodiments of the present invention employ an algorithm which may be run several times, iteratively. It neutralizes to a great extent the effect of outliers assuming the outliers are few relative the total number of measured data. The algorithm is highly suitable for hardware implementation since it is data-independent and uses only easily implementable operations. It is also pipelineable and possible to parallelize to a great extent in order to reach the high throughput requirements.

The method according to an embodiment described herein below has the advantage of avoiding inverse matrix calculations, which could be an ill-conditioned operation that is complex and computationally intensive.

In addition, the method has an advantage over fast least absolute deviation algorithms, an example of which is discussed in "A Maximum Likelihood Approach to Least Absolute Deviation Regression" by L. Yinbo and R. A. Gonzalo (EURASIP Journal on Applied Signal Processing 2004:12, Pp. 1762-1769, Hindawi Publishing Corp.). These algorithms are iterative and each iteration involves computing the weighted median, which essentially requires the sorting of weighted data. In addition, in these schemes the number of iterations needed for the required accuracy is unknown. In contrast thereto, the method of an embodiment of the present invention avoids the sorting of data, which is a data-dependent algorithm that is hard to handle in hardware implementation due to the unpredictable number of operations required.

According to the present invention, a current in a switched mode power supply is determined using linear least squares to fit a line defined by an equation having at least two coefficients to measured current values, the coefficients of the line being obtained using the relationship $c=AI_m$, where c is a vector of the coefficients, $I_m$ is a vector of the measured current values and A is a matrix relating c to $I_m$. Values representing at least one pre-calculated matrix A are stored, and measured current values are received, each value representing the current flowing in the switched mode power supply at a different time. The stored values representing the matrix A and the received measured current values are used to calculate a respective initial value for each of the coefficients of the line. For each measured current value:

an estimated current is calculated using the equation of the line and the calculated initial values of the coefficients;

a difference is determined between the measured current value and the estimated current value to generate a difference value; and the difference value is compared against a threshold and, if the difference value is greater than the threshold, updated values of the coefficients are calculated using the stored values representing the matrix A and the difference value. A value for the current in the switched mode power supply is determined using the updated values of the coefficients.

The present invention also provides an apparatus for calculating a current in a switched mode power supply. The apparatus comprises a current calculator configured to determine a current in the switched mode power supply using linear least squares to fit a line defined by an equation having at least two coefficients to measured current values, the coefficients of the line being obtained using the relationship $c=AI_m$, where c is a vector of the coefficients, $I_m$ is a vector of the measured current values and A is a matrix relating c to $I_m$. A memory for storing values representing at least one pre-calculated matrix A is also provided in the apparatus. The current calculator is configured to:

receive measured current values, each value defining the current flowing in the switched mode power supply at a different time;

use the stored values representing the matrix A and the received measured current values to calculate a respective initial value for each of the coefficients of the line;

for each measured current value:

calculate an estimated current using the equation of the line and the calculated initial values of the coefficients;

determine a difference between the measured current value and the estimated current value to generate a difference value; and compare the difference value against a threshold and, if the difference value is greater than the threshold, calculate updated values of the coefficients using the stared values representing the matrix A and the difference value; and determine a value for the current in the switched mode power supply using the updated values of the coefficients.

The present invention also provides a switched mode power supply having an apparatus to calculate the current therein as set out above.

The present invention further provides a computer program product comprising a computer-readable storage medium or a signal carrying computer program instructions which, if executed by a processor, cause the processor to perform a method as set out above.

BRIEF DESCRIPTION OF THE DRAWINGS

Embodiments of the invention will now be explained by way of example only, in detail, with reference to the accompanying figures, in which.

DETAILED DESCRIPTION OF EMBODIMENTS

Figure 2A:
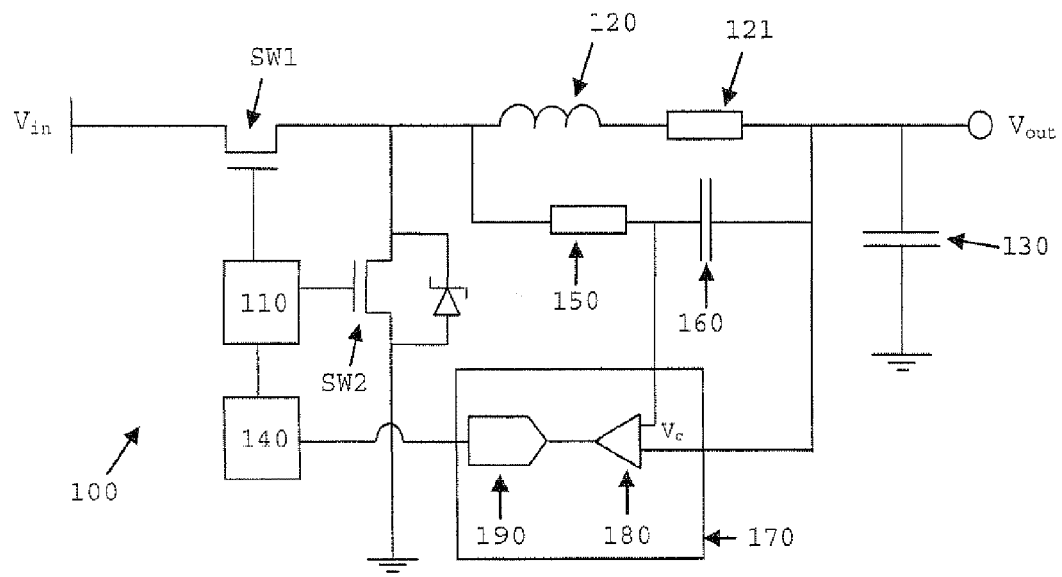
FIG. 2A is a schematic of a switched power supply according to an embodiment of the present invention.

FIG. 2A is a schematic of a switched mode DC/DC power supply 100 according to a first embodiment of the present invention. The power supply includes transistors SW1 and SW2 which are preferably power MOSFETs. The switching of transistors SW1 and SW2 is controlled by a PWM controller 110. The PWM controller 110 is configured to apply voltage pulses preferably at a frequency in the range between 20 kHz and 1 MHz to the gates of transistors SW1 and SW2, and to vary the duty cycle of the switching in response to a feedback signal received from a signal processing unit 140. Alternatively, instead of the PWM controller 110 a frequency-modulating controller (not shown) can be used, which modulates the frequency at which pulses of a fixed duration are generated. The source terminal of transistor SW1 is connected to a DC voltage line at $V_{in}$ while the source of transistor SW2 is connected to a reference point such as earth. The drain of each transistor is connected to an output filter, which in this example comprises an inductor 120 of inductance L and intrinsic DC resistance (DCR) 121 of resistance $R_L$, and a capacitor 130 of capacitance $C_f$, which are connected as shown in FIG. 2A.

Figure 1:
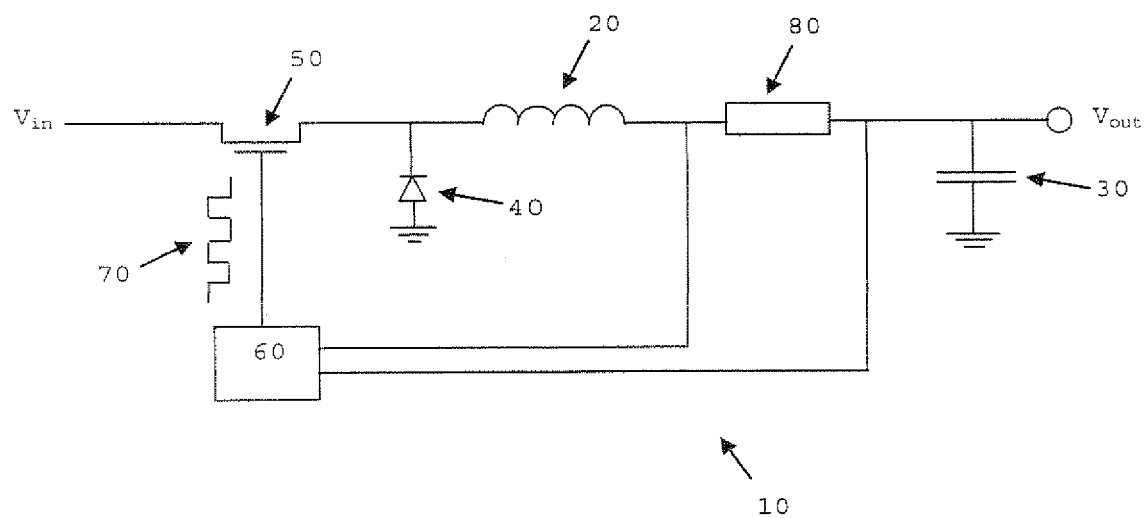
FIG. 1 is a schematic of a conventional switched mode DC/DC power supply.

In the circuit of FIG. 2A, as in most switched DC/DC converter topologies, it is the current in the inductor 120 in the output filter that is of interest to measure. The current in the inductor 120 may be measured using a resistive current shunt in series with the inductor, as shown in FIG. 1. However, this degrades the power efficiency of the converter. It is therefore preferable to use a "lossless" method which exploits the inevitable parasitic resistance in the inductor, such as that described in "A Simple Current-Sense Technique Eliminating a Sense Resistor" (Linfinity Application Note AN-7, Rev. 1.1, July 1998). The voltage over the DCR resistance $R_L$ is superimposed with a large square wave. This square wave can be removed with an RC circuit, comprising a resistor 150 of resistance R in series with a capacitor 160 of capacitance C, which is connected in parallel with the inductor as shown in FIG. 2A.

The voltage drop $V_C$ across the capacitor 160 can be expressed as a function of the inductor current $i_L$ as follows:

$$V_C(s) = R_L \frac{(1 + sL/R_L)}{1 + sCR} i_L(s) = R_T(s) i_L(s), \quad \text{Eqn. 1}$$

where $R_T(s)$ is defined as the equivalent transimpedance and s is frequency. By setting the two time constants to be equal, i.e. $L/R_L = CR$, a pole/zero cancellation is obtained, yielding:

$$V_C(s) = R_L i_L(s) \quad \text{Eqn. 2}$$

Hence, the transimpedance $R_T(s) = R_L$ becomes purely resistive and independent of frequency, allowing $i_L$ to be determined simply. However, the zero/pole cancellation is sensitive to component variations, which is illustrated by the following design example.

Taking a typical inductor with L=1 µH and $R_L$=1 mΩ, the simplified result of Eqn. 2 may be achieved by choosing C=1 µF and R=1 kΩ. The resistance should be large enough in order to avoid large additional power losses. The zero/pole cancellation sensitivity is illustrated using standard tolerances of 20 percent for the inductor and capacitor, and 1 percent tolerance for the resistor. The resulting maximum and minimum variations in the magnitude of impedance $R_T(s)$ (in dBΩ) and the corresponding maximum and minimum phase variations are shown in the Bode diagram in FIG. 3.

Above 1 kHz the impedance varies up to ±3.5 dB but these static variations can be eliminated by calibration. However, the variations over time caused by changing external conditions will introduce errors in the current measurement. These variations have to be handled in another way. In "Digital Autotuning System for Inductor Current Sensing in Voltage Regulation Module Applications" by S. Saggini et al. (IEEE Trans. on Power Electronics, Vol. 23, No. 5, September 2008), a digital autotuning system is presented for compensation of these variations. This algorithm can be used in the present embodiment to improve the current determination accuracy even further.

Referring again to FIG. 2A, the power supply 100 includes a sampler 170 for obtaining samples of a voltage (here, the voltage difference $V_C$) which is related to a current flowing in the SMPS, for input to the signal processing unit 140. In the present embodiment, the sampler 170 comprises a differential amplifier 180 for amplifying the voltage difference $V_C$ and an analog-to-digital converter (ADC) 190 for digitizing the signal input thereto by the differential amplifier 180. Since the inputs of the differential amplifier have the (potentially high) output voltage $V_{out}$ as reference, it is preferable that the differential amplifier has a high common mode rejection ratio (CMRR).

The amplifier 180 is preferably designed for the following maximum current:

$$\hat{I} = I_{DCmax} + \frac{I_{ripplepk-pk}}{2} + I_{headroom} \quad \text{Eqn. 3}$$

where $I_{DCmax}$ is the maximum current that the inductor/converter should continuously deliver, and $I_{headroom}$ gives a head room for current transients, e.g. 50% of $I_{DCmax}$.

Because the voltage drop $R_L i_L$ is small, the peak-to-peak amplitude of the ripple current can be determined by the differential equation $$v(t) = L \frac{d}{dt} i(t). \quad \text{Eqn. 4}$$

Solving for the current yields the following integral equation:

$$i(t) = \frac{1}{L} \int v(t) dt \quad \text{Eqn. 5}$$

Figure 4:
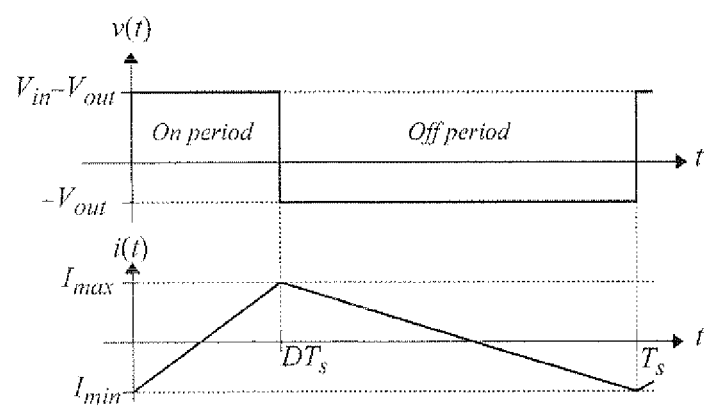
FIG. 4 is a schematic showing the voltage across and current in the inductor of FIG. 2A during a switch period.

The time function of the voltage over the inductor is a square wave, as shown in FIG. 4.

Solving Eqn. 5 for the ON- and OFF-periods, respectively, yields the ripple current peak to peak value of $$I_{ripplepk-pk} = \frac{V_{in} - V_{out}}{L} DT_s = \frac{V_{out}}{L} (1-D) T_s \quad \text{Eqn. 6}$$

During steady state the duty cycle can be approximated with $D = V_{out}/V_{in}$. Equation 6 needs to be computed for the used input and output voltage ranges in order to find the maximum ripple current $I_{ripplepk-pk}$.

Figure 3:
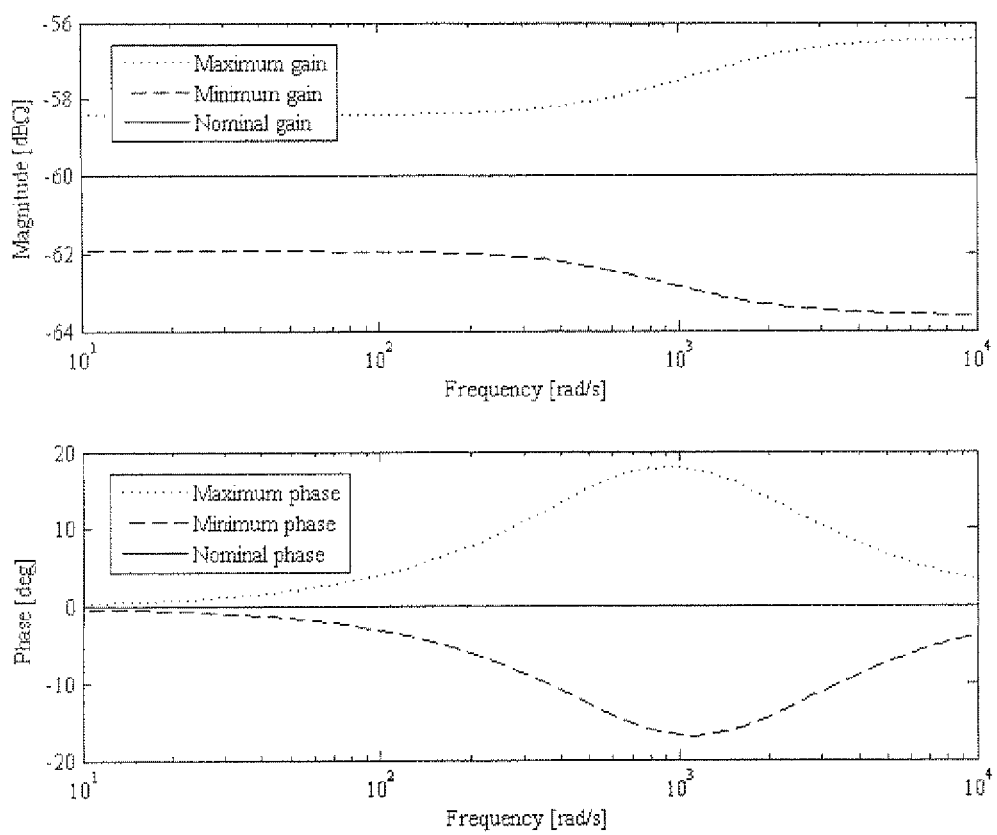
FIG. 3 is a Bode diagram illustrating the effect of errors in the electrical component values of the embodiment.

For example, if we assume a switch frequency of $f_s$=300 kHz, a maximum current of $I_{DCmax}$=20 A, a head room of 50 percent, an input voltage range $V_{in}$=5-15 V, and an output voltage range $V_{out}$=0-5 V, then the maximum ripple current becomes $I_{ripplepk-pk}$=14 A and the maximum current becomes $\hat{I}$=20+14/2+0.5·20=37 A. The maximum current corresponds to a maximum voltage according to Eqn. 1. Including component tolerances, the maximum impedance becomes $|R_T(s)|_{max}$=−56.5 dBΩ, as shown in FIG. 3. This yields the maximum voltage across the capacitor $V_{Cmax}$=55.5 mV. With the maximum input voltage of the ADC taken as $V_{ADCmax}$=1 V, the differential amplifier gain for normal operation is $$G_{normal} = \frac{V_{ADCmax}}{V_{Cmax}} = 25 \text{ dB} \quad \text{Eqn. 7}$$

The ADC 190 is configured to digitize the signal input thereto to generate sample current values each representing the current flowing in the inductor at a different time. The ADC has a resolution of N bits, where N is selected having regard to the competing requirements for N to be small in order to ensure that the digitization time of each sample is sufficiently small for the selected sampling rate on the one hand and, on the other, for N to be large in order to minimise the ADC quantization noise, which will increase the uncertainty of the current measurement. If the ADC has N bits and a symmetric input range $\{-V_R, V_R\}$ is assumed, the quantization step becomes:

$$Q = \frac{2V_R}{2^N} = \frac{V_R}{2^{N-1}} \quad \text{Eqn. 8}$$

The maximum quantization error is Q/2. The ADC 190 may sample continuously or in bursts whose timing and duration are controlled by the controller 110, thus allowing the sampler 170 to output current sample values obtained during the whole of period $T_s$ or only a specific portion thereof. Signals representing the measured current values are fed from the ADC 190 to the signal processing unit 140 connected thereto.

The differential amplifier 180 and ADC 190 can readily be implemented in hardware in a form that meets the requirements of a particular SMPS by those skilled in the art, such that a further detailed description of these components and other related design criteria is unnecessary.

Figure 2B:
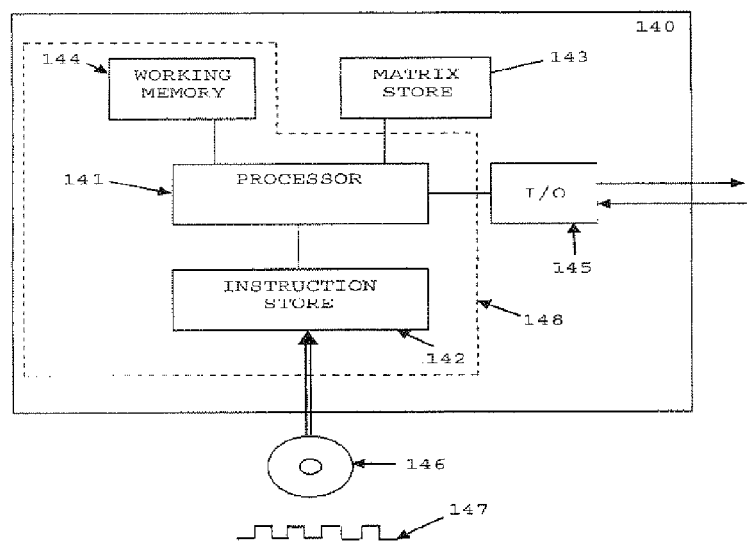
FIG. 2B shows the components of the signal processing unit shown in FIG. 2A.

FIG. 2B shows the configuration of the signal processing unit 140. In this embodiment, the signal processing unit 140 comprises a processor 141, and an instruction store 142 storing computer-readable instructions which, when executed by the processor 141 cause the processor 141 to perform the processing operations hereinafter described to calculate a current value. The instruction store 142 may comprise a ROM which is pre-loaded with the computer-readable instructions. Alternatively, the instruction store 142 may comprise a RAM or similar type of memory, and the computer readable instructions can be input thereto from a computer program product, such as a computer-readable storage medium 146 such as a CD-ROM, etc. or a computer-readable signal 147 carrying the computer-readable instructions.

The signal processing unit 140 further comprises a matrix store 143 for storing one or more pre-computed matrices, as described below, that are used in the current calculation, and a working memory 144 for storing input current samples values and data during computation. The signal processing unit 140 also includes an input/output section 148 for receiving measured current values and outputting a value for a current calculated by the processor, for example, an estimated maximum current $I_{max}$ in the inductor, an estimated minimum current $I_{min}$ or an average of $I_{max}$ and $I_{min}$. The calculated current can be used by the controller 110, as required, for feedback control, detection of continuous and discontinuous conduction modes, current protection etc.

Although the differential amplifier 180, the ADC 190 and the signal processing unit 140 are shown in FIG. 2A as separate components, one or more of these components may be implemented in a single integrated circuit (IC), which may form part of the IC of the controller 110. For example, a single IC may provide the functionality of the controller 110, signal processing unit 140, and optionally the ADC 190. Accordingly, this single IC can be manufactured and sold separately from the remaining components of the switched mode power supply.

In the present embodiment, the processor 141, instruction store 142 and working memory 144 together constitute a current calculator 148 for determining a current value in the SMPS.

The processing operations performed by the current calculator 148 in the present embodiment to calculate a current value for the switched mode power supply will now be described with reference to FIGS. 5-7.

Figure 5:
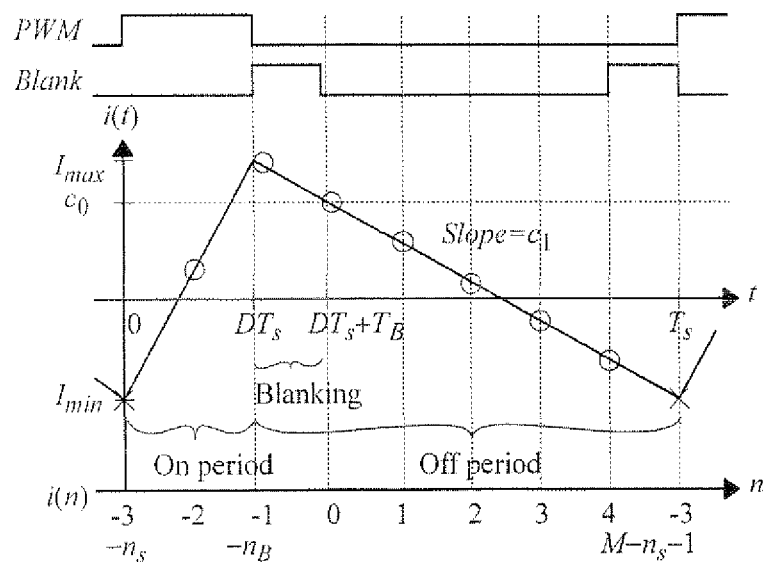
FIG. 5 is an illustration of the current waveform and control signals over a switch period.

A typical current waveform i(t) and control signals are shown schematically in FIG. 5. The signal labelled "PWM" illustrates voltage pulses applied by PWM controller 110 to transistor SW1, while the signal labelled "Blank" illustrates a blanking signal, which may be used by the current calculator 148 to exclude one or more measured current values from among the received measured current values for its calculation of a current estimate in the SMPS. The blanking signal may be generated by the controller 110 or internally by the current calculator.

As explained above, aberrations due to parasitic inductances and capacitances in the power circuit may require the use of a blanking period $T_B$. That is, samples obtained during this period are preferably not used since they may be rendered statistically insignificant by the switch noise. The dead times during transitions from the ON-period to the OFF-period (and vice versa) may introduce errors in the current measurement which cause the current to deviate from the ideal triangular waveform.

In the embodiment the oversampling ratio is M. In other words, M current samples are obtained per switch period $T_s$. In FIG. 5, "n" denotes the sample index. The numbering starts with 0 for the first used sample, which in FIG. 5 is the first sample to appear in the time sequence after the ON-period and the following blanking period $T_B$, have elapsed. In the present embodiment, where the duty cycle is less than 50%, samples obtained during the OFF-period are preferably used in the calculation, which is described below with reference to FIGS. 6 and 7. The blanking period $T_B$ is preferably chosen to be an integer multiple $n_b$ of $T_{so}$, which is the sampling interval defined by $T_{so}=T_s/M$. The number of the unused samples in the switch period is then given by:

$$n_s = \left\lceil \frac{DT_s}{T_{so}} \right\rceil + \left\lceil \frac{T_B}{T_{so}} \right\rceil = \lceil DM \rceil + n_b \qquad \text{Eqn. 9}$$

The last sample index is $M-n_s-1$, and the duty cycle in terms of the number of samples (in other words, the number of samples in an ON-period) is $n_d=\lceil DM \rceil$. Here, the usual notation $\lceil \ \rceil$ is used to denote the ceiling function. If the duty cycle is larger than 50%, the calculation is preferably performed on sample values which are obtained outside the blanking period during the ON-period instead of during the OFF-period. However, if the duty cycle is such that $$n_b+1 \leq n_d \leq M-n_b-1, \qquad \text{Eqn. 10}$$

then samples outside the blanking periods in both the ON-period and the OFF-period may be used for computing current estimates. For a certain duty cycle range, these estimates can be combined by averaging to decrease the uncertainty, as will be explained below.

If the voltage across the inductor 120 is assumed to be almost constant, the current according to Eqn. 5 is an affine function of time. Suppressing the sample interval, $T_{so}$, this function can be expressed in the present example as $$i(n) = c_0 + c_1 n + e(n), \qquad \text{Eqn. 11}$$

where $c_0$ and $c_1$ are real numbers and components of a vector c such that $c^T=[c_0 \ c_1]$, and e(n) is a disturbance often called noise.

Although i(n) is linear in n in the present embodiment, i(n) may more generally be expressed as the sum of a constant and one or more terms each being a different function of n (e.g. a second degree polynomial in n) and thus define a line which need not be straight. Thus a "line" as referred to herein is defined by an equation having at least two coefficients, and thus encompasses both a straight line as defined by Eqn. 11 and lines which are not straight (that is, curved). However, i(n) should be linear in the coefficients c.

Sample values of the measured current are placed in a column vector $I_m$ and the following equation system is obtained:

$$Xc = I_m - e_m, \qquad \text{Eqn. 12}$$

where the sample index matrix X is defined as:

$$X = \begin{bmatrix} 1 & 0 \\ 1 & 1 \\ \vdots & \vdots \\ 1 & M-n_s-1 \end{bmatrix} \qquad \text{Eqn. 13}$$

and the errors e(n) are expressed by the vector $e_m$. If there are more than two samples, i.e. $M-n_s>2$, then Eqn. 12 becomes an overdetermined equation system, which is often not possible to solve. By choosing c as the least squares estimate $$c=(X^TX)^{-1}X^TI_m=AI_m, \qquad \text{Eqn. 14}$$

the $l_2$ norm of $e_m$ becomes minimized. It is important to note that since the matrix $A=(X^TX)^{-1}X^T$ is determined by the duty cycle D, the blanking time $n_b$ and the oversampling ratio M, it is not data-dependent and can thus be pre-calculated and stored in matrix store 143. The A matrix is commonly referred to as the Moore-Penrose pseudoinverse of X.

The current calculator 148 may be configured to vary the blanking time $T_B$ in response to a change in the duty cycle D such that $M-n_s$, and thus the size of the X and A matrices required, does not change. This has the advantage that a relatively small number of values corresponding to the elements of only a single A matrix need to be stored.

However, in the present embodiment, $T_B$ is set to a fixed value which is chosen to be substantially equal to the duration of the switch noise, thus ensuring that only the samples which are likely to be erroneous are excluded, in order to maximise the number of samples used in the calculation. The duration of the switch noise is affected by the power train components, the PCB layout, and the input and output voltages. Setting $T_B$ to an appropriate fixed value has the advantage of allowing better estimates of the fitting parameters $c_0$ and $c_1$ to be found. In this case, a number less than M/2 of different A matrices have to be pre-calculated and stored in the matrix store 143. It is a significant advantage of the present embodiment that the A matrix is pre-calculated for subsequent use, since these calculations involve the finding of an inverse of a matrix, which could be ill-conditioned numerically. Proper methods with full precision for calculating the different A matrices are preferably used when pre-computing the set of A matrices.

The least squares algorithm is highly sensitive to outliers. In the present embodiment, there is uniformly distributed quantization noise from the ADC 190 with a maximum error of Q/2, where Q is the quantization step in the ADC. In addition, it is noted that the current is not exactly affine with time as the voltage in the capacitor is not exactly constant. Simulations show that it is advantageous to treat a sample value having a deviation of at least 2Q an outlier, i.e.

$$|I_m(n)-X_nc|>2Q \qquad \text{Eqn. 15}$$

However, this limit has to be adjusted according to the noise situation on the actual measurement system noise signature.

An obvious solution to the problem presented by outliers is to simply exclude outliers when re-computing more accurate least squares values for c. However, in an on-line situation this would require the computing of a unique A matrix for each modified selection of samples. This has the serious draw-back of the inverse matrix computation that would be needed being ill-conditioned, computationally intensive and relatively complex to implement. Avoiding these problems by pre-storing all possible A matrices would be impractical because of the size of the memory required to store the almost innumerable A matrices. The present inventors have devised a highly effective complement to the least squares algorithm for increasing the statistic robustness which overcomes these problems, as will now be described with reference to the flow charts in FIGS. 6 and 7.

Figure 6:
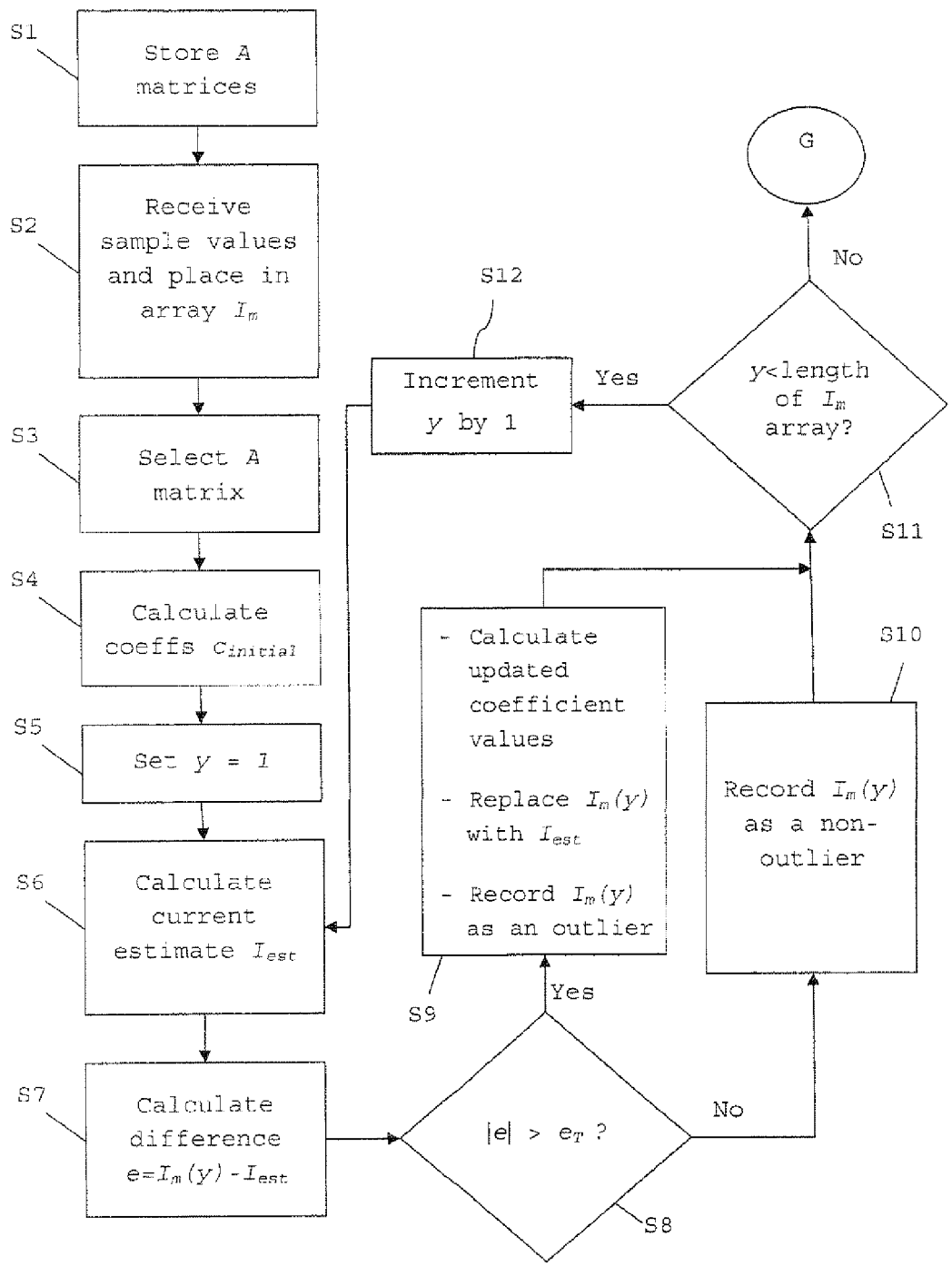
FIGS. 6 and 7 are flowcharts showing the processing operations performed in the embodiment to calculate the current in an SMPS.

Referring to FIG. 6, in step S1, values representing a plurality of pre-calculated matrices A are stored in matrix store 143. The values are calculated using an assumed model i(n) for the current shape (e.g. Eqn. 11). Each of the A matrices has a different size such that it may be multiplied by a current vector $I_m$ having the corresponding size (i.e. number of elements for holding measured current values). The matrix element values may be calculated by the current calculator or computed externally and input to the signal processing unit.

In step S2, the current calculator 148 receives measured current values from the sampler 170, each received value representing the current flowing in the SMPS at a different time during a switch period of the SMPS. In the present embodiment, the received values are obtained by the sampler 170 operating in burst mode and thus correspond to current values measured during only a portion of a switch period $T_s$. More specifically, since in the present embodiment D is smaller than 50% and it is preferable to disregard the sample values obtained during the blanking period $T_B$ immediately following an ON-OFF transition, the sampler obtains sample values only during the period $(1-D)T_s-T_B$ immediately preceding the following OFF-ON transition. Naturally, if D is greater than 50%, the current calculator may receive sample values obtained by the sampler 170 only during the period $DT_s-T_B$ immediately preceding an ON-OFF transition. Alternatively, the sampler may sample during both the ON-period and OFF-period, or only portions of each period and provide the current calculator with corresponding sets of sample values. The sampler may obtain samples during consecutive switch periods or during intervals which are separated by one or more switch periods. The received sample values are stored in an array $I_m$ in working memory 144.

As an alternative, the sampler 170 may sample in continuous mode to continuously obtain measured current values each representing a current flowing in the SMPS (that is, the current in the inductor 120 in the embodiment of FIG. 2A) at a different time. In this case, the current calculator 148 may select only a portion of the received values, which were obtained during a switch period. For example, if D is smaller than 50% and it is preferable to disregard the sample values obtained during the blanking period $T_B$ following an ON-OFF transition, the current calculator may select values only during the period $(1-D)T_s-T_B$ immediately preceding the following OFF-ON transition. Of course, if D is greater than 50%, the current calculator may select sample values obtained by the sampler only during the period $DT_s-T_B$ immediately preceding an ON-OFF transition. Alternatively, the current calculator may select values obtained during both the ON-period and OFF-period or only portions of each said period. As in the present embodiment, the selected sample values in these alternative embodiments are stored in an array $I_m$ in working memory 144.

In step S3 an A matrix is selected by the current calculator 148 from among the plurality of A matrices stored in matrix store 143. The selection is performed in dependence on the number of measured current values in the current array $I_m$. More particularly, in order to calculate the coefficient vector c by evaluating the product of matrix A and the current vector $I_m$, the current calculator selects an A matrix which has the correct dimension for the particular current array $I_m$ obtained from the received sample values. As can be seen from Eqns. 9, 13 and 14, the relevant dimension of A is, in the present embodiment, a function of M, D, $T_B$ and $T_s$. Naturally, if only one pre-calculated A matrix is stored, step S3 can be omitted.

In step S4 the current calculator performs a least squares calculation to find an initial vector of the coefficients $c_{initial}$ which has as its elements the initial values for coefficients $c_0$ and $c_1$, which are denoted $c_{0,1}$ and $c_{1,1}$, respectively. These initial values are calculated using the values which represent the selected matrix A and the measured current values in the current array $I_m$, namely by evaluating the product $AI_m$.

In step S5 a counter "y", which serves as an index for the elements of the current array $I_m$, is set equal to 1. In step S6 an estimated value for the current ($I_{est}$) at a time corresponding to sample index y is evaluated using the equation of the line i(n) given by Eqn. 11 together with the calculated initial values of the coefficients, $C_{0,1}$ and $c_{1,1}$. For example, with y=1, $I_{est}$=$c_{0,1}$ while for y=2, $I_{est}$=$c_{0,1}$+$c_{1,1}$, for y=3, $I_{est}$=$c_{0,1}$+2$c_{1,1}$ . . . for y=M−$n_s$, $I_{est}$=$c_{0,1}$+(M−$n_s$)$c_{1,1}$.

In step S7 a difference between the actual sample value $I_m$(y) (received at step S2) and the corresponding estimated value of the current $I_{est}$ (calculated at step S6) is calculated to give a difference value e=$I_m$(y)−$I_{est}$.

In step S8, the difference value e is compared against a threshold $e_T$ (where $e_T$>0), which in this embodiment is set to 2Q in accordance with Eqn. 15. If the difference value is greater than the threshold, then, in step S9, the sample $I_m$(y) is identified as an outlier and updated values of the coefficients are calculated using the stored values representing the selected matrix A and the difference value e. In other words, the logic statement: (e>$e_T$) OR (e<−$e_T$), is evaluated and, if the statement is true (that is, if either inequality is satisfied), updated values for the coefficients are calculated using the stored values representing the selected matrix A and the difference value e. The updated values of coefficients $c_0$ and $c_1$ are denoted $c_{0,2}$ and $c_{1,2}$, respectively, and may be calculated by first creating a copy of the initial coefficient vector $c_{initial}$ calculated in step S4. An updated vector $c_{updt}$ having as its elements updated values of the coefficients, i.e. $c_{0,2}$ and $c_{1,2}$, may then be calculated by subtracting from the copy of $c_{initial}$ the product of the $y^{th}$ column of matrix A and the difference e. In other words, in the present embodiment $c_{updt}$ is set equal to $c_{initial}$ and then $c_{updt}$=$c_{updt}$−A(:,y)*e is evaluated. In this way, the adverse effect of the outlier sample value on the calculated values of the fitting coefficients is quickly and effectively mitigated, notably without recalculating matrix A or repeating the least squares calculation.

Furthermore, if it is determined at step S8 that the difference value for the sample value in the $y^{th}$ element of the $I_m$ array is greater than the threshold, then in step S9 it is preferable that in addition to updated values of the coefficients being calculated, the said sample value is replaced with the corresponding estimated current value. This may be done by replacing the $y^{th}$ sample value in $I_m$ with the estimated value or, as in the present embodiment, by creating a copy of $I_m$, the copy being denoted $I_{mcorr}$, and replacing the $y^{th}$ sample value in $I_{mcorr}$ with the corresponding estimated current value.

In addition, if it is determined at step S8 that the difference value for the sample value in the $y^{th}$ element of the $I_m$ array is greater than the threshold, it is also preferable for the current calculator to store in working memory 144 an indication or record that the $y^{th}$ sample value is an outlier, meaning that it has a difference value which is greater than the threshold. For this purpose, an outlier array of the same length (that is, the same number of elements) as $I_m$ may be used, with the $y^{th}$ element of the outlier array being set to a first value (e.g. 1) if the $y^{th}$ value in $I_m$ is identified as an outlier. On the other hand, if it is determined in step S8 that the difference value for the sample value in the $y^{th}$ element of the $I_m$ array is not greater than the threshold then, in step S10, a second value, such as zero, is stored so that the sample value is identified as a non-outlier. Alternatively, the indication or record may be set initially to hold default values of 0 which are changed to 1 in step S9 for outliers, with the result that step S10 can then be omitted as the 0 values are already present in the indication or record.

In step S11, it is determined whether the counter value y is smaller than the number of elements in the array $I_m$. If so, y is incremented by 1 in step S12 and steps S6 to S11 are repeated. However, if y is the same as the length of the current array $I_m$, such that all of the elements in the $I_m$ array have been processed, the loop terminates. In this way or by applying another suitable condition at step S11 (e.g. is y equal to the length of the $I_m$ array? If not, increment y by 1 at step 12, else terminate the loop), steps S6 to S11 are performed for each of the sample values in the $I_m$ array. Once all the repetitions of steps S6 to S11 have been processed an updated set of coefficient values, which have been corrected for all outlier values in the original $I_m$ array, is obtained.

For better results, the calculation of improved estimates for the coefficients and the outlier estimate replacement can he performed iteratively. In other words, the performance of steps similar to steps S6 to S11 for each of the values of y, which yields a better estimate of c than $c_{initial}$, can be performed and in the following iteration, the determination of whether a sample value is an outlier (and the subsequent further correction of c to yield a further improved estimate for c and replacement of outlier current values with corresponding estimates) is performed using the estimate for c obtained in the previous iteration. Thus each iteration yields a least squares estimate computed on the data having modified outliers. For these reasons, it is preferable that the process proceeds to step S13 in FIG. 7 after all of the samples values in $I_m$ have been processed, so that at least one further iteration is performed.

During the outlier estimate replacement and correction of the least squares coefficients estimate $c_{updt}$ obtained at the end of the process in FIG. 6, samples not previously identified as outliers (in step S8) may fall outside the outlier limit. This is handled by the next iteration of the process, as described below with reference to FIG. 7.

Figure 7:
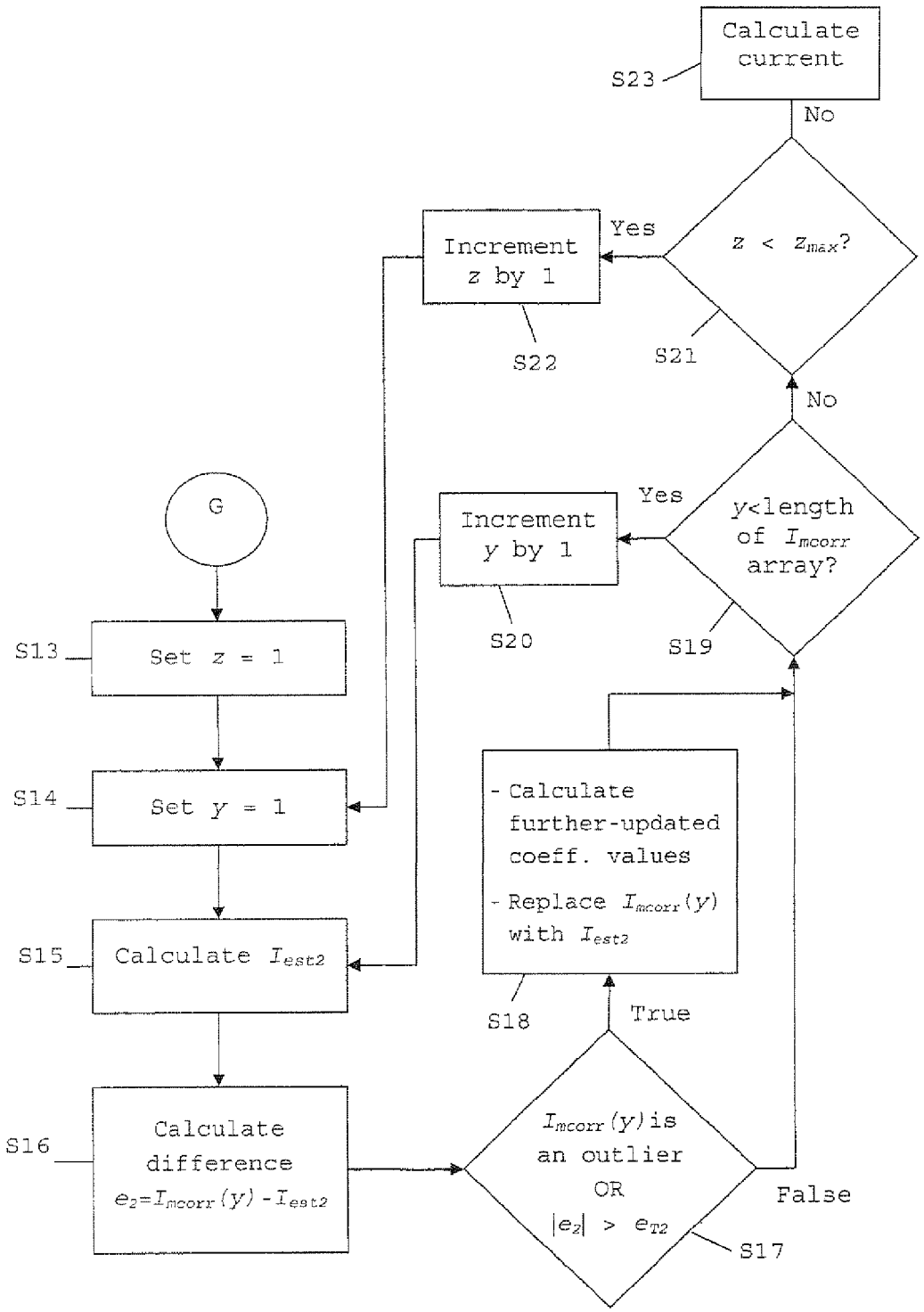

In step S13 of FIG. 7, an iteration counter z is set to the value 1. In step S14, a counter "y", which serves as an index for the elements of the current array $I_{mcorr}$, is set equal to 1. In step S15 a second estimated value $I_{est2}$ for the current at a time corresponding to sample index y is evaluated using the equation of the line together with the calculated updated values of the coefficients, i.e. $c_{0,2}$ and $c_{1,2}$. For example, with y=1, $I_{est2}$=$c_{0,2}$ while for y=2, $I_{est2}$=$c_{0,2}$+$c_{1,2}$, for y=3, $I_{est2}$=$c_{0,2}$+2$c_{1,2}$ . . . for y=M−$n_s$, $I_{est2}$=$c_{0,2}$+(M−$n_s$)$c_{1,2}$.

In step S16 a difference between $I_{mcorr}$(y) and the corresponding second estimated value of the current $I_{est2}$ is calculated to give a second difference value $e_2$=$I_{mcorr}$(y)−$I_{est2}$.

In step S17, it is determined whether the value $I_{mcorr}$(y) is a replacement value and, if not, the second difference value $e_2$ is compared against a second threshold $e_{T2}$ (where $e_{T2}$>0), which in this example is set to 2Q in accordance with Eqn. 15. However, it is noted that $e_T$ and $e_{T2}$ may or may not be the same. If the value $I_{mcorr}$(y) is identified as a replacement value (which may be done efficiently simply by checking the corresponding entry in the outlier array) or the second difference value is greater than the second threshold, further-updated values of the coefficients are calculated in step S18 using the stored values representing the selected A matrix and the second difference value $e_2$. In other words, the logical statement: (the $y^{th}$ element of the outlier array identifies the current value in $I_{mcorr}(y)$ as an outlier) OR ($e_2 > e_{T2}$) OR ($e_2 < -e_{T2}$) is evaluated and, if as a result of this evaluation this statement is true (i.e. if any of these three conditions holds true), further-updated values for the coefficients are calculated using the stored values representing the selected A matrix and the second difference value $e_2$. However, where the logical statement is false, the process proceeds to step S19.

The further-updated values of coefficients $c_0$ and $c_1$ are denoted $c_{0,3}$ and $c_{1,3}$, respectively, and may be calculated by first creating a copy of the updated coefficient vector $c_{updt}$ obtained at the end of the process shown in FIG. 6. A further-updated vector $c_{updt2}$ having as its elements updated values of the coefficients, i.e. $c_{0,3}$ and $c_{1,3}$, may then be calculated by subtracting from the copy of $c_{updt}$ the product of the $y^{th}$ column of the A matrix and the second difference value $e_2$. In other words, in the present embodiment $c_{updt2}$ is set equal to $c_{updt}$ and then $c_{updt2} = c_{updt2} - A(:y)*e_2$ is evaluated. In this way, the adverse effect of any samples values which are identified as outliers to the line defined by the updated values of the coefficients, $c_{updt}$, but which were not outliers to the line defined by $c_{initial}$, is quickly and effectively mitigated, notably without recalculating matrix A or repeating the least squares calculation.

If the second difference value is greater than the second threshold or if the value $I_{mcorr}(y)$ is identified as a replacement value, it is preferable that in addition to further-updated values of the coefficients being calculated, the said sample value $I_{mcorr}(y)$ is replaced with the corresponding second estimated value $I_{est2}$. This may be done by replacing the $y^{th}$ sample value in $I_{mcorr}$ with the second estimated value or by creating a copy of $I_{mcorr}$ and replacing the $y^{th}$ sample value in the copy of $I_{mcorr}$ with the corresponding second estimated value.

In step S19, the current calculator determines whether the current counter value y is smaller than the number of elements in the array $I_{mcorr}$. If so, y is incremented by 1 in step S20 and steps S15 to S19 are repeated. However, if y is the same as the length of the current array $I_{mcorr}$, such that all of the elements in the $I_{mcorr}$ array have been processed, the loop terminates. In this way or by applying another suitable condition at step S19 (e.g. is y equal to the length of the $I_{mcorr}$ array? If not, increment y by 1, else go to step S21), steps S15 to S19 are performed for each of the sample values in the $I_{mcorr}$ array. Once the all the repetitions of steps S15 to S19 have been processed, a further-updated set of coefficient values, $c_{updt2}$, which have been corrected for all outlier values in the $I_{mcorr}$ array, is obtained.

On the other hand, if as a result of step S19 it is determined that all of the entries in the $I_{mcorr}$ array have been processed, the process proceeds to step S21, where the current calculator 148 determines if the iteration counter z has reached a pre-determined limit $z_{max}$, which in the present embodiment is 2 but could more generally be any integer greater than 1. If z has not reached the pre-determined value, in step S22 the iteration counter z is incremented by 1 and steps S14 to S21 are then repeated. However, if z is equal to the predetermined limit, the process proceeds to step S23. Although the criterion for determining whether to repeat steps S14 to S21 is whether the counter z has reached a predetermined limit in the present embodiment, other criteria may be used. For example, further iterations may be performed until the error (e.g. the standard deviation) in a current value calculated using the calculated coefficients becomes smaller than a pre-determined value or until $z = z_{max}$.

In step S23 a value for the current in the SMPS, for example the maximum current, minimum current and/or an average current, is calculated using the most up-to-date values of the coefficients which have been calculated. Since the current attains its maximum and its minimum at times which are outside the measuring periods in the present embodiment, extrapolation has to be used. The extrapolation for the minimum current is only one sample period, thus $$I_{min} = c_0 + c_1(M - n_s). \qquad \text{Eqn. 16}$$

The maximum current is extrapolated over the blanking period, which consists of $n_b$ samples, according to $$I_{max} = c_0 - c_1 n_b \qquad \text{Eqn. 17}$$

The DC current is equal to the average of the minimum and maximum currents, $I_{min}$ and $I_{max}$, due to the triangular current wave form, and hence is expressed as $$I_{DC} = \frac{I_{min} + I_{max}}{2} = c_0 + \frac{c_1}{2}(M - n_s - n_b) \qquad \text{Eqn. 18}$$

Since the DC current estimate is a weighted sum of current samples, the error in the estimate becomes approximately normally distributed according to the central limit theorem provided the number of current samples is sufficiently large. The peak current calculations can be used for improvement of the converter's low load efficiency by turning OFF transistor SW2 when the current becomes negative, i.e., diode emulation which enables discontinuous conduction mode.

The processing operations described above with reference to the flowcharts of FIGS. 6 and 7 can also be described in pseudo-code, for example as follows.

The operations of FIG. 6 can be represented as:

```
A=Aset(nd,nb); % Select the A matrix
Im_corr=Im; % Copy original sample
% Original least squares calculation
c(1)=c(2)=0; % Initialize the solution
for k=1:length(Im)
    c(1)=c(1)+A(1,k)*Im(k);
    c(2)=c(2)+A(2,k)*Im(k);
end
% Outlier correction algorithm
cn=c; % Copy coefficients
lim=2*Q; % Outlier limit
for i=1:length(Im)
    % For each sample calculate I estimate
        if i=1
            Iest=c(1); % Initialize, first sample
        else
            Iest=Iest+c(2); % Increase current with slope
        end
    e=Im(i)-Iest; % Calculate difference value
    % Check if outlier and correct,
        if (e>lim) or (e<-lim)
            cn=cn-A(:,i)*e; % Update the coefficients
            % Replace outliers for next iteration
            Im_corr(i)=Iest;
            outlier_list(i)=1; % Record as outlier
        else
            outlier_list(i)=0; % Record as not an outlier
        end
end
```

The operations of FIG. 7 can be represented as:

```
Iter=2; % Number of iterations
cnn=cn; % Copy coefficients
for j=1:Iter;
    for i=1:length(Im_corr)
```

-continued

```
% For each sample calculate I estimate
    if i=1
        Iest=cn(1); % Initialize, first sample
    else
        Iest=Iest+cn(2); % Increase current with slope
    end
    e=Im_corr(i)-Iest; % Calculate second difference value
        if (outlier_list(i)=1) or (e>lim) or (e-lim)
            cnn=cnn-A(:,i)*e; % Update the coefficients
            Im_corr(i)=Iest; % Replace with better estimate
        end
    end % end of i loop
    cn=cnn; % Copy coefficients before next iteration
end % end of j loop
```

Studies of how the uncertainty of the current estimate depends on the duty cycle, the oversampling ratio, the ADC resolution, and on outliers are presented in the following.

Figure 8:
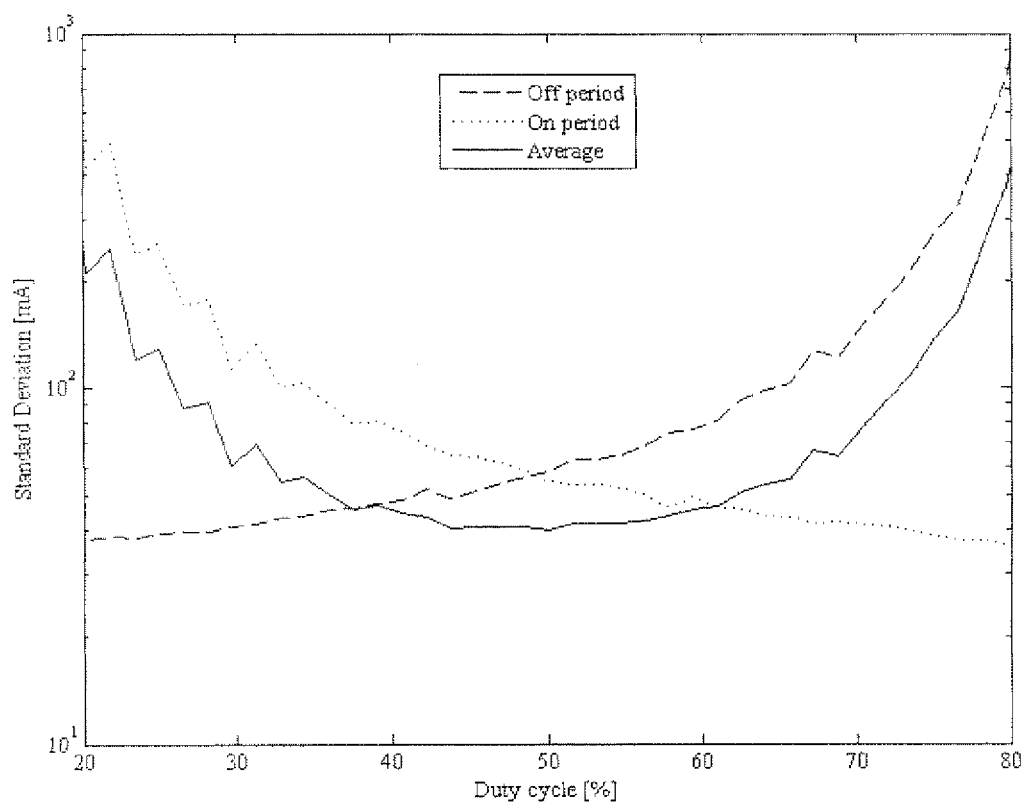
FIG. 8 is in a plot of the standard deviation in the calculated current values versus duty cycle for the embodiment.

FIG. 8 is a plot of the standard deviation in the calculated values of the current as a function of the duty cycle, obtained in a simulation. Here, the input voltage is a constant 12 V and the duty cycle is swept from 20 to 80 percent. The ADC has a resolution of N=6 bits, and an oversampling ratio of M=64 has been used. Each measurement is contaminated with a uniformly-distributed noise with a maximum deviation of Q/2. The worst case error using single period measurement is when the duty cycle is 50 percent. This is mainly due to the error increasing with the decreasing number of samples used in the current estimate calculations. If the duty cycle is larger than 50 percent the ON-period current measurement is preferable. Combining the measurements from the ON-period and OFF-period by averaging increases the accuracy for a duty cycle within the range from 40% to 60%. Henceforth, only the OFF-period measurements are considered for simplicity.

There is a trade-off between number of bits used in the ADC and the sampling rate. Therefore, it is of interest to study the relation between the quantization error and the estimation error of the current.

Figure 9:
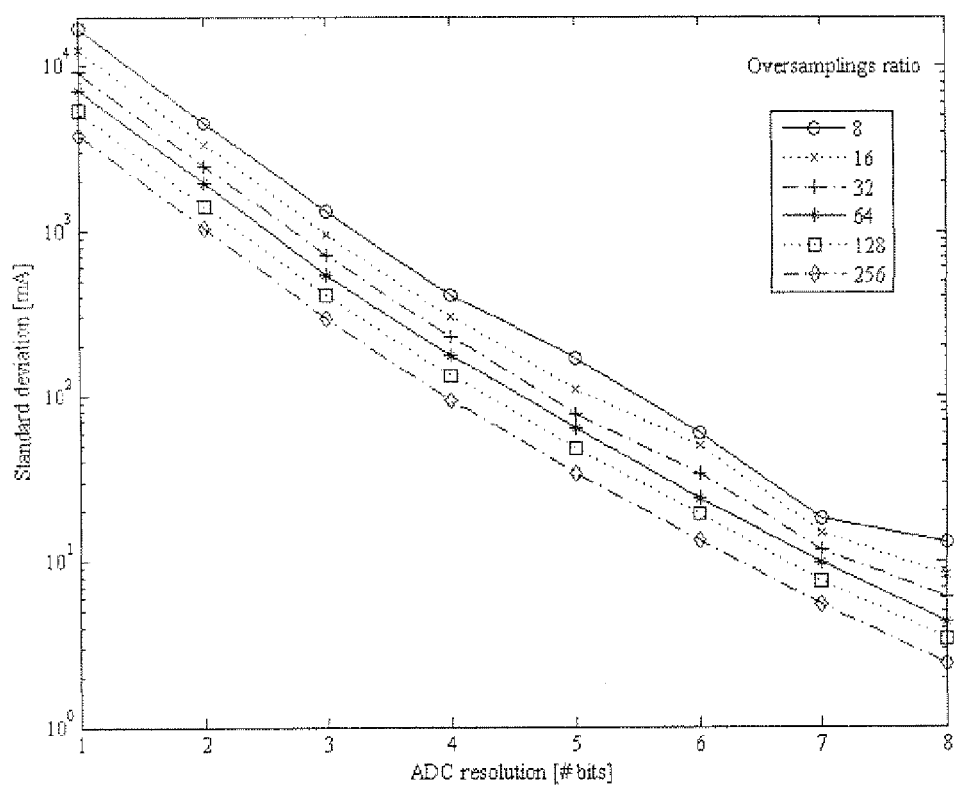
FIG. 9 is a plot of the standard deviation in the calculated current values as a function of the ADC resolution and oversampling ratio for the embodiment.

Using the worst case duty cycle of 50 percent and $V_{in}$=10 V, and $V_{out}$-5 V, the current measurement uncertainty versus oversampling ratio M and the ADC resolution is shown in FIG. 9. A resolution of 6 bits and an oversampling ratio of 64 is chosen, which yields a ±3σ accuracy of ±30 mA.

Figure 10:
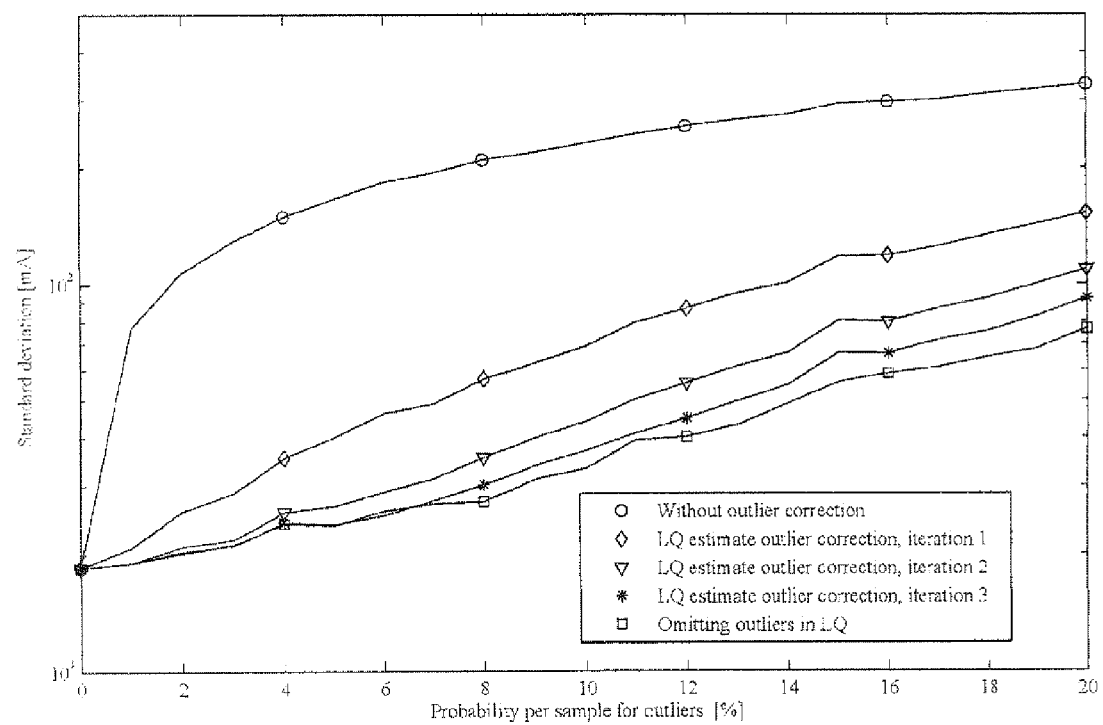
FIG. 10 illustrates how the accuracy of the calculated current in the embodiment changes as the number of iterations of the calculation algorithm changes.

The above-described embodiment has been implemented and its performance simulated. FIG. 10 is a plot of the standard deviation in current estimates calculated without outlier correction, with least squares outlier corrections calculated using the method of the embodiment, and by omitting outliers altogether in a least squares calculation. The standard deviation is plotted as a function of the probability per sample of an outlier. In the simulations the outliers were assumed to deviate in both directions and to have random amplitude in the range between 3Q and 8Q. The outliers have a very large impact on the current measurement uncertainty. A small increase in the probability for outliers corresponds to a large increase in the error. Omitting the outliers in a new least square estimate is an effective method of reducing the error but requires a lot of matrix manipulation, including calculation of the inverse. The method of the present embodiment yields only slightly worse uncertainty, already after the first iteration. After two and three iterations the results almost coincide with the result obtained using the method of omitting outliers in probability for outliers up to 5 and 10 percent, respectively.

[Modifications and Variations]

Many modifications and variations can be made to the embodiment described above.

For example, in the embodiment described above the current calculator 148 comprises a programmable processing apparatus having a processor 141 which performs the current calculation operations in accordance with software instructions stored in instructions store 142. However, it will be appreciated that the current calculator may be configured otherwise. For example, current calculator 148 may comprise non-programmable hardware (e.g. an ASIC) dedicated to performing the current calculations.

Although a plurality of A matrices are calculated and stored in step S1 of FIG. 6 in the embodiment above, this is not required by the present invention so that instead a single A matrix may be stored in step S1. However, the storage of values representing a plurality of pre-calculated A matrices provides the current calculator with the flexibility to perform calculations on current arrays $I_m$ of different lengths. This provides the current calculator with the further advantage of being able to calculate estimates of current values (e.g. an estimated maximum current $I_{max}$ in part of the SMPS circuit (e.g. the filter inductor), an estimated minimum current $I_{min}$ or an average of $I_{max}$ and $I_{min}$) with a smaller error by using in its calculation as many sampled current values as are available under the prevailing conditions (duty cycle, switch noise characteristics etc.).

In the flowcharts of FIGS. 6 and 7 and the pseudo-code above, the processing operations are performed in a particular order. However, the order of many of the operations can be changed. For example, steps S6 to S10 are performed iteratively for each sample $I_m(y)$ in the $I_m$ array such that the steps are performed for one sample before they are performed for the next sample. However, instead, step S6 may be performed for all samples, followed by step S7 for all samples, followed by step S8 for all samples, etc. Similarly, in FIG. 7, steps S15 to S18 are performed for each sample before they are performed for the next sample. However, instead, step S15 may be performed for all samples, followed by step S16 for all samples, followed by step S17 for all samples, etc.

Although an embodiment in the form of a dc/dc power supply has been described, it will be appreciated that the techniques of the present invention are applicable to other types of switched mode power supplies.

The invention claimed is:

1. A method of determining a current in a switched mode power supply using linear least squares to fit a line defined by an equation having at least two coefficients to measured current values, the coefficients of the line being obtained using the relationship $c=AI_m$, where c is a vector of the coefficients, $I_m$ is a vector of the measured current values and A is a matrix relating c to $I_m$, the method comprising:
   storing values representing at least one pre-calculated matrix A;
   receiving measured current values ($I_m(y)$), each value representing the current flowing in the switched mode power supply at a different time;
   using the stored values representing the matrix A and the received measured current values ($I_m(y)$) to calculate, with a processor, a respective initial value for each of the coefficients of the line;
   for each measured current value:
      calculating, with the processor, an estimated current ($I_{est}$) using the equation of the line and the calculated initial values of the coefficients;

determining, with the processor, a difference between the measured current value ($I_m(y)$) and the estimated current value ($I_{est}$) to generate a difference value (e); and comparing, with the processor, the difference value (e) against a threshold ($e_T$) and, if the difference value is greater than the threshold, calculating updated values of the coefficients using the stored values representing the matrix A and the difference value (e); and determining, with the processor, a value for the current in the switched mode power supply using the updated values of the coefficients.

2. The method according to claim 1, wherein values representing a plurality of pre-calculated A matrices are stored such that each stored A matrix has a different size, and the method further comprises selecting from said plurality of pre-calculated A matrices an A matrix for use in processing the received measured current values ($I_m(y)$) such that the selection is performed in dependence upon the number of measured current values.

3. The method according to claim 1, wherein the process of determining a value for the current in the switched mode power supply using the updated values of the coefficients comprises:

replacing each measured current value ($I_m(y)$) having a difference value (e) greater than the threshold ($e_T$) with the corresponding estimated value ($I_{est}$) to generate a corrected set of current values ($I_{mcorr}(y)$) containing measured current values and replacement current values;

for each current value in the corrected set:

calculating a second estimated current value ($I_{est2}$) using the equation of the line and the updated values of the coefficients;

determining a difference between the current value ($I_{mcorr}(y)$) and the second estimated current value ($I_{est2}$) to generate a second difference value ($e_2$); and if the current value is a replacement current value or if the second difference value ($e_2$) is greater than a second threshold ($e_{T2}$), calculating further-updated values of the coefficients using the stored values representing the matrix A and the second difference value ($e_2$); and determining a value for the current in the switched mode power supply using the further updated values of the coefficients.

4. The method according to claim 3, further comprising:

for each measured current value having a difference value (e) greater than the threshold ($e_T$), storing an indication that the measured current value has a difference value greater than the threshold, and wherein the further-updated values of the coefficients are calculated for a current value being processed if a said indication is stored for the current value or if the second difference value ($e_2$) is determined to be greater than the second threshold ($e_{T2}$).

5. The method according to claim 3, wherein the threshold ($e_T$) is equal to the second threshold ($e_{T2}$).

6. An apparatus for calculating a current in a switched mode power supply, the apparatus comprising:

a current calculator comprising a microprocessor configured to determine a current in the switched mode power supply in accordance with software instructions stored in an instruction store, using linear least squares to fit a line defined by an equation having at least two coefficients to measured current values, the coefficients of the line being obtained using the relationship $c = AI_m$, where c is a vector of the coefficients, $I_m$ is a vector of the measured current values and A is a matrix relating c to $I_m$; and a memory for storing values representing at least one pre-calculated matrix A, wherein the current calculator is configured to:

receive measured current values ($I_m(y)$), each value defining the current flowing in the switched mode power supply at a different time;

use the stored values representing the matrix A and the received measured current values ($I_m(y)$) to calculate a respective initial value for each of the coefficients of the line; and for each measured current value:

calculate an estimated current ($I_{est}$) using the equation of the line and the calculated initial values of the coefficients;

determine a difference between the measured current value ($I_m(y)$) and the estimated current value ($I_{est}$) to generate a difference value (e); and compare the difference value (e) against a threshold ($e_T$) and, if the difference value is greater than the threshold, calculate updated values of the coefficients using the stored values representing the matrix A and the difference value (e); and determine a value for the current in the switched mode power supply using the updated values of the coefficients.

7. The apparatus according to claim 6, wherein the memory is arranged to store values representing a plurality of pre-calculated A matrices, each stored A matrix having a different size, and the current calculator is further configured to select from said plurality of pre-calculated A matrices stored in the memory an A matrix for use in processing the measured current values ($I_m(y)$) such that the selection is performed in dependence upon the number of measured current values.

8. The apparatus according to claim 6, wherein the current calculator is configured to determine a value for the current in the switched mode power supply using the updated values of the coefficients by:

replacing each measured current value ($I_m(y)$) having a difference value (e) greater than the threshold ($e_T$) with the corresponding estimated value ($I_{est}$) to generate a corrected set of current values ($I_{mcorr}(y)$) containing measured current values and replacement current values;

for each current value in the corrected set:

calculating a second estimated current value ($I_{est2}$) using the equation of the line and the updated values of the coefficients;

determining a difference between the current value ($I_{mcorr}(y)$) and the Second estimated current value ($I_{est2}$) to generate a second difference value ($e_2$); and if the current value is a replacement current value or if the second difference value ($e_2$) is greater than a second threshold ($e_{T2}$), calculating further-updated values of the coefficients using the stored values representing the matrix A and the second difference value ($e_2$); and determining a value for the current in the switched mode power supply using the further updated values of the coefficients.

9. The apparatus according to claim 8, wherein the current calculator is configured to:
store in the memory, for each measured current value ($I_m(y)$) having a difference value (e) greater than the threshold ($e_T$), an indication that the measured current value has a difference value greater than the threshold, and
calculate the further-updated values of the coefficients for a current value being processed if a said indication is stored for the current value or if the second difference value ($e_2$) is determined to be greater than the second threshold ($e_{T2}$).

10. The apparatus according to claim 8, wherein the threshold ($e_T$) is equal to the second threshold ($e_{T2}$).

11. An apparatus for calculating a current in a switched mode power supply, the apparatus comprising:
a current calculator comprising non-programmable hardware configured to determine a current in the switched mode power supply using linear least squares to fit a line defined by an equation having at least two coefficients to measured current values, the coefficients of the line being obtained using the relationship $c=AI_m$, where c is a vector of the coefficients, $I_m$ is a vector of the measured current values and A is a matrix relating c to $I_m$; and
a memory for storing values representing at least one pre-calculated matrix A, wherein the current calculator is configured to:
receive measured current values ($I_m(y)$), each value defining the current flowing in the switched mode power supply at a different time;
use the stored values representing the matrix A and the received measured current values ($I_m(y)$) to calculate a respective initial value for each of the coefficients of the line; and
for each measured current value:
calculate an estimated current ($I_{est}$) using the equation of the line and the calculated initial values of the coefficients;
determine a difference between the measured current value ($I_m(y)$) and the estimated current ($I_{est}$) to generate a difference value (e); and
compare the difference value (e) against a threshold ($e_T$) and, if the difference value is greater than the threshold, calculate updated values of the coefficients using the stored values representing the matrix A and the difference value (e); and
determine a value for the current in the switched mode power supply using the updated values of the coefficients.

12. A switched mode power supply, comprising
an apparatus for calculating a current in a switched mode power supply, the apparatus comprising:
a current calculator comprising a microprocessor configured to determine a current in the switched mode power supply in accordance with software instructions stored in an instruction store, using linear least squares to fit a line defined by an equation having at least two coefficients to measured current values, the coefficients of the line being obtained using the relationship $c=AI_m$, where c is a vector of the coefficients, $I_m$ is a vector of the measured current values and A is a matrix relating c to $I_m$; and a memory for storing values representing at least one pre-calculated matrix A, wherein the current calculator is configured to:
receive measured current values ($I_m(y)$), each value defining the current flowing in the switched mode power supply at a different time;
use the stored values representing the matrix A and the received measured current values ($I_m(y)$) to calculate a respective initial value for each of the coefficients of the line; and
for each measured current value:
calculate an estimated ($I_{est}$) using the equation of the line and the calculated initial values of the coefficients;
determine a difference between the measured current value ($I_m(y)$) and the estimated current value ($I_{est}$) to generate a difference value (e); and
compare the difference value (e) against a threshold ($e_T$) and, if the difference value is greater than the threshold, calculate updated values of the coefficients using the stored values representing the matrix A and the difference value (e); and
determine a value for the current in the switched mode power supply using the updated values of the coefficients.

13. The switched mode power supply of claim 12, wherein the apparatus further comprises:
the memory, of the apparatus, stores values representing a plurality of pre-calculated A matrices, each stored A matrix having a different size, and
the current calculator is further configured to select from said plurality of pre-calculated A matrices stored in the memory an A matrix for use in processing the measured current values ($I_m(y)$) such that the selection is performed in dependence upon the number of measured current values.

14. The switched mode power supply of claim 12, wherein the current calculator is configured to determine a value for the current in the switched mode power supply using the updated values of the coefficients by:
replacing each measured current value ($I_m(y)$) having a difference value (e) greater than the threshold ($e_T$) with the corresponding estimated value ($I_{est}$) to generate a corrected set of current values ($I_{mcorr}(y)$) containing measured current values and replacement current values;
for each current value in the corrected set:
calculating a second estimated current value ($I_{est2}$) using the equation of the line and the updated values of the coefficients;
determining a difference between the current value ($I_{mcorr}(y)$) and the second estimated current value ($I_{est2}$) to generate a second difference value ($e_2$); and
if the current value is a replacement current value or if the second difference value ($e_2$) is greater than a second threshold ($e_{T2}$),
calculating further-updated values of the coefficients using the stored values representing the matrix A and the second difference value ($e_2$); and
determining a value for the current in the switched mode power supply using the further updated values of the coefficients.

15. The switched mode power supply of claim 14, wherein the current calculator is further configured to:
store in the memory, for each measured current value ($I_m(y)$) having a difference value (e) greater than the threshold ($e_T$), an indication that the measured current value has a difference value greater than the threshold, and
calculate the further-updated values of the coefficients for a current value being processed if a said indication is stored for the current value or if the second difference value ($e_2$) is determined to be greater than the second threshold ($e_{T2}$).

16. The switched mode power supply of claim 14, wherein the threshold ($e_T$) is equal to the second threshold ($e_{T2}$).

* * * * *

UNITED STATES PATENT AND TRADEMARK OFFICE
CERTIFICATE OF CORRECTION

| | | |
|---|---|---|
| PATENT NO. | : 8,676,525 B2 | Page 1 of 1 |
| APPLICATION NO. | : 13/321915 | |
| DATED | : March 18, 2014 | |
| INVENTOR(S) | : Holmberg et al. | |

It is certified that error appears in the above-identified patent and that said Letters Patent is hereby corrected as shown below:

On the title page, item (75), under "Inventors", in Column 1, Line 1, delete "Torbjorn" and insert -- Torbjörn --, therefor.

On the title page, item (57), under "ABSTRACT", in Column 2, Lines 16-17, delete "coefficients" and insert -- coefficients. --, therefor.

In the Specification

In Column 3, Line 58, delete "stared" and insert -- stored --, therefor.

In Column 7, Line 32, delete "section 148" and insert -- section 145 --, therefor.

In Column 12, Line 22, delete "can he" and insert -- can be --, therefor.

In Column 13, Line 53, delete "integergreater" and insert -- integer greater --, therefor.

In Column 15, Line 42, delete "$V_{out}$-5 V," and insert -- $V_{out}$=5 V, --, therefor.

Signed and Sealed this
Eighth Day of July, 2014

Michelle K. Lee
*Deputy Director of the United States Patent and Trademark Office*